United States Patent [19]
Wallace

[11] Patent Number: 5,010,447
[45] Date of Patent: Apr. 23, 1991

[54] DIVIDED CAPACITOR MOUNTING PADS
[75] Inventor: James S. Wallace, Sugarland, Tex.
[73] Assignee: Texas Instruments Incorporated, Dallas, Tex.
[21] Appl. No.: 290,778
[22] Filed: Dec. 28, 1988
[51] Int. Cl.$^5$ ............................................... H05K 7/10
[52] U.S. Cl. ..................................... 361/400; 361/403
[58] Field of Search ........... 361/392, 393, 395, 321 C, 361/400, 409, 397, 403

[56] References Cited
U.S. PATENT DOCUMENTS
4,882,656 11/1989 Menzies, Jr. et al. ............... 361/393

Primary Examiner—Leo P. Picard
Assistant Examiner—Donald A. Sparks
Attorney, Agent, or Firm—Ronald O. Neerings; Thomas W. DeMond; Melvin Sharp

[57] ABSTRACT

A split bonding pad provides a positive electrical indication of the proper electrical and mechanical connection of a capacitor to a printed circuit board by placing the electrical component terminal in series with electrical power supplied to a memory device while the electrical component remains in parallel connection with the memory device power lead. The proper mounting of the electrical component to the board becomes testable by testing continuity of a series circuit through the leads extending to the split bonding pad.

10 Claims, 2 Drawing Sheets

DIVIDED CAPACITOR MOUNTING PADS

BACKGROUND OF THE INVENTION

This invention relates generally to surface mounting electrical components on printed circuit boards and relates particularly to surface mounting electrical components on printed circuit boards under integrated circuits or other components while furnishing a positive indication of the proper soldering of the electrical components to the printed circuit boards. This indication occurs even though the electrical component rests substantially concealed from sight beneath the integrated circuit package or carrier.

Present memory products such as large capacity—256K—dynamic read only memory devices (DRAMs) often come mounted in close proximity to one another on printed circuit boards. Surface mount technology uses gull wing of J-leads depending from the device package or carriers to connect the device terminals to pads formed on the board using reflow soldering.

Decoupling capacitors, connected between the power supply leads of the devices, often come mounted on the boards with one capacitor reflow soldered to pads under each device. This obtains high density mounting of the memory devices and decoupling capacitors on the boards to reduce costs and reduce otherwise required mounting volume. The capacitor, having dimension of about 0.120×0.100×0.010 inches, extends into a well or cavity on the underside of each device package or carrier. With a number of leads, such as 18 for a 256K device, depending from the package periphery and soldering to the board, the decoupling capacitor substantially becomes enclosed and screened from sight rendering its visual inspection difficult, usually requiring a microscope. The close mounting of the packages further blocks the view of the capacitor under each package. In a J-lead package, the depending peripheral package material often extends to within 0.025 inch from the seating plane on the board. This leaves as little as 0.025 inch between the board and package and between the leads for visually inspecting the reflow soldering filets on the capacitor, which is only about 0.010 inch thick.

An industry-wide problem exists because automated manufacturing equipment occasionally misplaces the decoupling capacitors from their pads for reflow soldering. This results in the decoupling capacitors occasionally not becoming soldered to their intended pads and remaining loose under the memory device and enclosed by the leads. If inspection fails to catch the loose capacitor or a capacitor wrongly aligned, the capacitor end terminals can touch the device leads and short them electrically. This renders the entire memory circuit card unuseable, and renders the entire system, in which the memory card is mounted, inoperative. Memory cards returned because of loose capacitors cost the customer and marker money and reflect poorly on the manufacturing process. Occasionally, an eventually loose capacitor is held out of position and away from the device leads temporarily by solder flux residue or rests away from the device leads during electrical tests, and accordingly passes inspection by the maker. Later, in use, the capacitor unpredictably becomes loose, shorts together two or more leads and stops the customer's machine.

One solution tried operator visual inspection in addition to electrical testing. This increases cost and remains unreliable because of the small sized parts requiring a microscope and because of the restricted viewing space. Inspection with mechanized vision systems costs hundreds of thousands of dollars but provides only marginal improvement over manual optical inspection. The duplication of these mechanical vision systems and attendant maintenance costs and reduced serviceability of assembly equipment makes this approach to inspecting for failures unfeasible.

Another solution used for stop gap protection vibrates or shakes all assemblies to verify that no decoupling capacitor is loose. This misses, however, capacitors mis-soldered or held temporarily by the solder flux. Alternate inspection procedures include x-raying all cards, which is prohibitively expensive. The x-ray does show a mis-aligned capacitor but lacks sufficient resolution to confirm an acceptable solder joint.

While this problem has been described in conjunction with decoupling capacitors and DRAM devices, like problems exists with capacitors or other components mounted under other types of memory device, such as EEPROMS, EPROMS, ROMS and other integrated circuits.

SUMMARY OF THE INVENTION

The invention overcomes the described and other problems by placing one thermal of the decoupling capacitor in series with one power lead to the memory device. A misplaced or loose decoupling capacitor thus opens the power connection to the memory device, signaling a failure during the routine electrical test of the circuit card. This furnishes a positive test of the capacitor placement and adequacy of the reflow solder joint. It also eliminates further inspection.

The terminal of the decoupling capacitor becomes placed in series with the power lead by splitting one of its bonding pads into two separate pads, electrically isolated from one another. One part connects to a lead sourcing power and the other part connects to the power lead of the memory device. The two parts are spaced from one another by about a certain distance and the terminal of the decoupling capacitor extents at least said certain distance. A properly placed or located capacitor mechanically bridges the two bonding pad parts with one terminal and proper solder joints between the terminal and the two bonding pad parts electrically bridges between the two parts to connect electrical power to the overlying memory device. An electrical test confirming power to the memory device confirms proper mechanical and electrical connection of the capacitor terminal to its pair of bonding pad parts.

This arrangement confirms proper mounting of the decoupling capacitor during the normally required electrical test for the card and eliminates additional visual inspection of the capacitor, a double-saving. Placing one terminal of an electrical component in series with the power lead to an integrated circuit or other device also finds utility in components mounted on the board out from under the integrated circuit or other devices.

DESCRIPTION OF THE PREFERRED EMBODIMENTS

Figure 1:
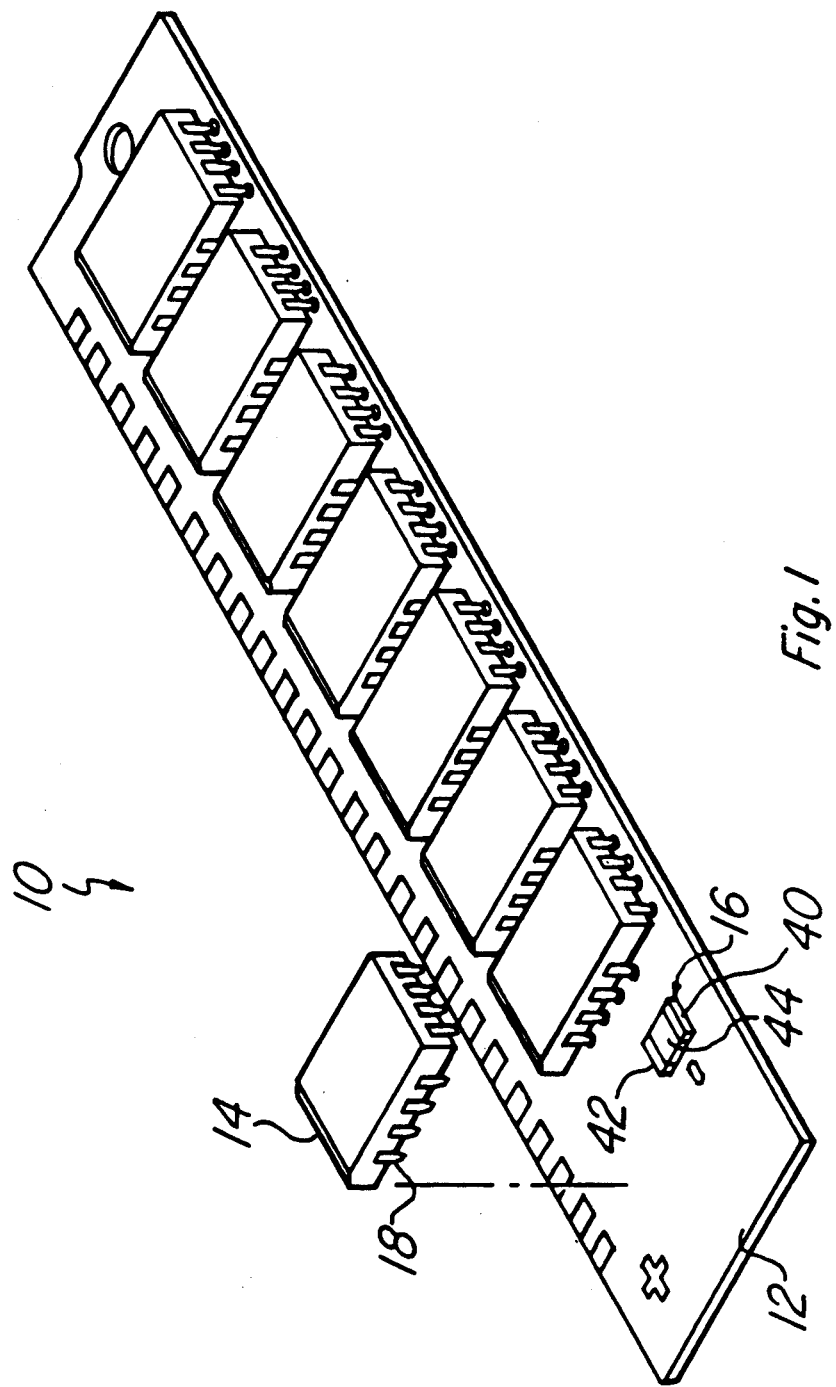
FIG. 1 is a perspective view of a printed circuit board or card carrying several memory devices with one memory device exploded from the board to show a decoupling capacitor mounted on the board beneath the one memory device.

In FIG. 1, printed circuit card assembly 10 comprises a printed circuit board 12 carrying eight memory devices 14 and eight decoupling capacitors 16, only one of which decoupling capacitor is shown. Memory devices 14 and capacitors 16 mount or connect to printed circuit bonding pads to be described on the printed circuit board 12 using surface mount technology. This avoids drilling multiple holes through the circuit board for receiving the plural leads 18 of each memory device as previously has occurred. Capacitors 16 also mount or connect to the printed circuit board 12 using surface mount technology also to avoid the numerous drilled and plated holes for mounting electrical components.

Each decoupling capacitor 16 is quite small and extends into a pocket formed in the bottom surface of the memory devices 14 to avoid interference between the decoupling capacitors and the memory devices with the decoupling capacitors mounted underneath the memory devices. The relative sizes of the memory devices 14 and of the decoupling capacitors 16, the proximity of the memory devices to the board 12 and the screening effect of the memory device terminal leads depicted in FIG. 1 convey some of the problem encountered in visually inspecting for proper placement and soldering of the decoupling capacitor 16 under the memory devices 14.

Figure 2:
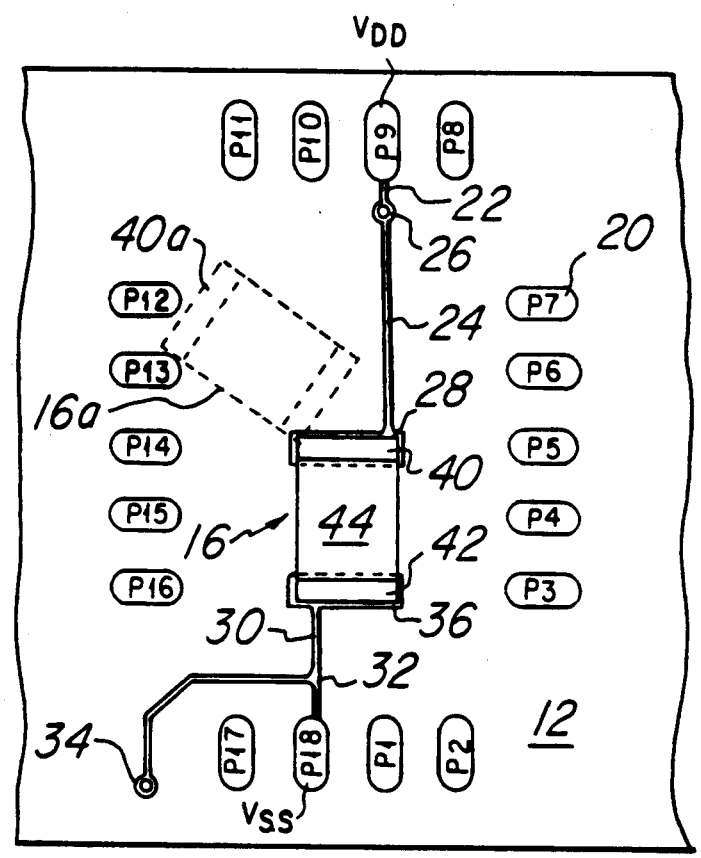
FIG. 2 is a plan view of a segment of the printed circuit board of FIG. 1 depicting bonding pads for the memory device and decoupling capacitor and depicting one properly mounted decoupling capacitor in solid lines and another loose capacitor in dashed lines outline.

In FIG. 2, printed circuit board 12 carries a plurality of device bonding pads 20, numbered from P1–P18. This numbering corresponds to the numbering of terminal leads for a standard plastic chip carrier package from such as Texas Instruments. Such a plastic chip carrier package often encloses a 256 K dynamic random access memory (DRAM); thus the circuit card assembly 10 of FIG. 1 can comprise a 256 K×8 memory array.

Returning to FIG. 2, with the standard plastic chip carrier package definition, bonding pad P9 connects to the power source of Vdd while bonding pad P18 connects to the power source Vss. Printed circuit board 12 further carries a pair of power leads 22 and 24 extending from a plated through hole 26 connected to a source of electrical power at Vdd. Lead 22 extends from the plated through hole 26 to bonding pad P9 while lead 24 extends from the plated through hole 26 to a capacitor bonding pad 28.

Printed circuit board 12 further carriers power leads 30 and 32 extending from plated hole 34, which connects to a source electrical power at voltage Vss. Lead 32 extends to bonding pad P18 for the memory device and lead 30 extends to capacitor bonding pad 36.

During assembly, a capacitor such as 16, depicted in solid lines, properly becomes placed on capacitor bonding pads 28 and 36 and is held in place by a solder paste, usually printed on the pads prior to assembly. A memory device also becomes placed on the printed circuit board 12 at bonding pads 20, numbered P1–P18 and also is held in place by solder paste. When all the components have been located or placed on the circuit board 12, the card assembly 10 passes through a soldering device to melt the solder paste and form good mechanical and electrical contact between the leads of all the electrical components and their respective bonding pads.

Capacitor 16 comprises a pair of end terminals 40 and 42 capping the ends; of a body portion 44. Most electrical components manufactured for surface mount technology have this same general arrangement of mounting terminals capping a central body. Metal terminal 40 thus becomes soldered to capacitor bonding pad 28 while metal terminal 42 becomes soldered to capacitor bonding pad 36. Body 44 comprises an insulating material enclosing the interior material providing the desired capacitance.

Occasionally, a capacitor 16a, depicted in dashed line outline, becomes misplaced on the printed circuit board 12 and fails to be properly soldered at either of capacitor bonding pads 28 or 36. In such case, the terminal 40a can bridge between two bonding pads 20, such as the bonding pads 20 numbered P12 and P13, to cause an electrical short circuit between those two bonding pads. This results in the problem previously described.

Figure 3:
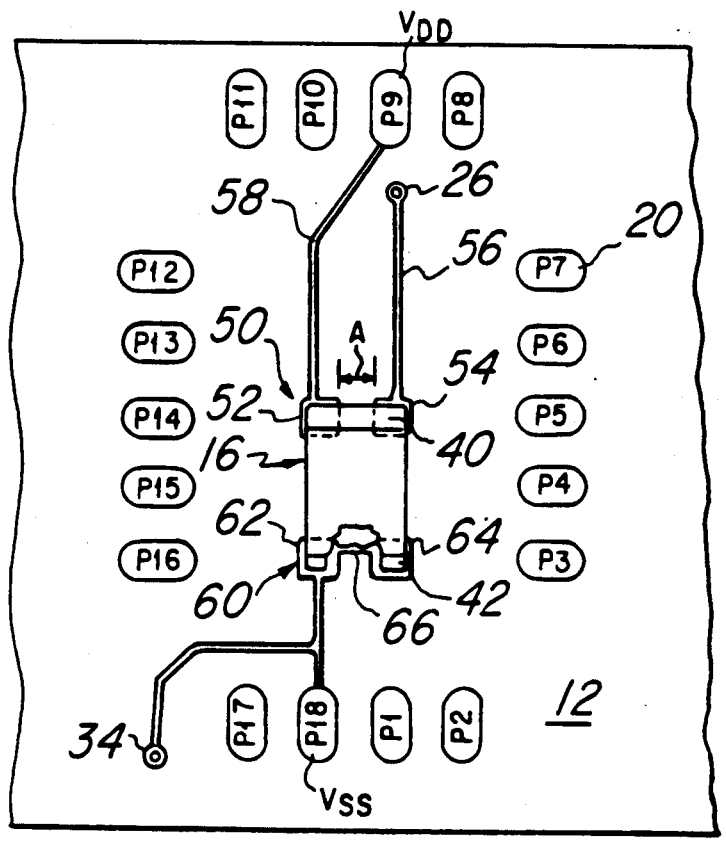
FIG. 3 is a plain view similar to FIG. 2 depicting capacitor bonding pads and a properly mounted decoupling capacitor according to the invention.

In FIG. 3, the invention furnishes a capacitor bonding pad 50 having two separate and electrically insulated parts 52 and 54 spaced from one another a certain distance A. Printed circuit board 12 carries one electrical power lead 56 extending from the plated through hole 26 to capacitor bonding pad part 54 and another lead extending from capacitor bonding pad part 52 up to bonding pad 20 number P9. The terminal 40 of capacitor 16 extends more than said certain distance A and is located or mounted mechanically and electrically to bridge the certain distance A between capacitor bonding pad parts 52 and 54. This places the terminal 40 in electrical series connection with leads 54 and 58 providing electrical power to bonding pad 20 number P9 from plated through hole 26. This closes the electrical circuit between the plated through hole 26 and bonding pad 20 number P9 confirming that the capacitor 16 rests properly mounted under the memory device 14. Any placement of the capacitor 16 other than bridging the space between bonding pad parts 52 and 54 opens the electrical power to bonding pad 20 number P9 providing a positive and ready test of a misplaced capacitor 16.

Capacitor bonding pad 60 presents a similar arrangement with a bonding pad part 62 and a bonding pad part 64 that are however connected together electrically and mechanically by a bridging lead 66. This substantially presents the same type of bonding pad depicted in FIG. 2 at 36.

Requiring only one connection between bonding pad parts 52 and 54 positively defines that the capacitor is fixed in position soldered to the bonding pad parts 52 and 54. Thus capacitor terminal 42—instead of 40— could extend between bonding pad parts 52 and 54 with capacitor terminal 40 spaced an equivalent distance toward bonding pad 20 number P9. While such a mounting keeps capacitor 16 from being connected between Vdd and Vss, it assures that the capacitor is secured to board 12.

If the user required the decoupling capacitor 16 to be connected by terminal 40 to bonding pad parts 52 and 54 and for capacitor terminal 42 to be bonded to bonding pad parts 62 and 64, the linking lead 66 could be opened and separate leads brought from plated hole 34 to one bonding pad part and a separate lead brought from the other bonding pad part to bonding pad 20 number P18. Thus an electrical open circuit between plated through hole 34 and bonding pad 20 number P18 would indicate the absence of the capacitor terminal 42 between bonding pad parts 62 and 64.

Modifications and variations of the invention can be obtained in light of the above teachings while remaining within the scope of the appended claims. For example, the exact location and outline of the capacitor bonding pads and power leads extending to and from them can be changed as desired. Also, the bonding pad arrangement to place the terminal of an electrical component in series with power to another device can be used at locations in the printed circuit board other than under a memory device or other integrated circuit or other device. This obtains the advantage of eliminating visual testing while furnishing the positive indication of proper reflow soldering through a routine electrical test. While not fully explored, the split bonding pad part arrangement may provide a degree of self alignment of the electrical component through the surface tension of the solder wetting the entire length of the electrical component terminal cap. The invention also finds utility in locations where electrical components must be connected to leads other than those supplying electrical power, and where the leads or circuits are carried on substrates other than printed circuit boards.

I claim:

1. An arrangement for surface mounting an electrical component in a desired circuit that is carried on an insulating substrate, the arrangement being testable electrically to indicate the proper mechanical mounting of said component, said arrangement comprising:
   A. a first pad carried on said substrate and at which said component is to be mounted, said first pad having two parts electrically insulated from one another and spaced from one another by a certain distance;
   B. said component having a first terminal with a dimension of at least said certain distance, said component being mounted to said two parts of said first pad to bridge mechanically and electrically the space between said two parts with said terminal; and
   C. one lead in said desired circuit extending to one part of said first pad and another lead in said desired circuit extending to the other part of said first pad to place said component terminal bridging said space between said pad parts in series with said leads so that proper mechanical mounting of said terminal to said two pad parts becomes testable by a series circuit through said leads.

2. The arrangement of claim 1 in which said component has two ends with said first terminal at one end and a second terminal at the other end and said arrangement includes a second pad at which said second terminal is mounted to place said component in series with said first and second pads.

3. The arrangement of claim 1 in which said leads carry electrical power.

4. The arrangement of claim 1 in which said space is about 0.015 to 0.020 inches.

5. The arrangement of claim 1 in which said leads supply electrical power to said one pad part and carry electrical power from said second pad.

6. The arrangement of claim 1 in which said component is a capacitor.

7. An arrangement for surface mounting electrical components on a substrate of insulating material, comprising:
   A. one group of pads carried on said substrate and placed substantially in a rectangular array, one pad requiring electrical power and another pad requiring electrical ground;
   B. a power lead and a ground lead carried on said substrate;
   C. one component mounted to said one group of pads;
   D. another group of pads carried on said substrate within the array of said one group of pads and under said one component, said another group of pads including a first pad connected to said power lead and a second pad connected to said ground lead, at least said first pad having two parts electrically insulated from one another and spaced from one another by a certain distance, one of said pad parts being connected to said power lead and the other pad part being connected to said one pad of said one group requiring electrical power; and
   E. another component mounted to said another group of pads under said one component, said another component having a first terminal and a second terminal, said second terminal being mounted to said second pad of said another group, said first terminal being dimensioned to be at least said certain distance and said first terminal being mounted to said two parts of said first pad to bridge mechanically and electrically said space between said two pad parts so that power flows in parallel through said power lead to said one another components and flows in series through said another component first terminal.

8. The arrangement of claim 7 in which said one component is an integrated circuit and said another component is a capacitor.

9. The arrangement of claim 7 in which said another component has two ends with one end carrying said first terminal and the other end carrying said second terminal.

10. The arrangement of claim 7 in which said certain distance is about 0.015 to 0.020 inches.

* * * * *